(12) United States Patent
Mizutani et al.

(10) Patent No.: US 7,851,707 B2
(45) Date of Patent: Dec. 14, 2010

(54) CIRCUIT BOARD AND METHOD FOR MANUFACTURING THE SAME

(75) Inventors: Daisuke Mizutani, Kawasaki (JP); Tatsuhiko Tajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 395 days.

(21) Appl. No.: 11/591,559

(22) Filed: Nov. 2, 2006

(65) Prior Publication Data

US 2008/0022518 A1     Jan. 31, 2008

(30) Foreign Application Priority Data

Jul. 31, 2006  (JP) .............................. 2006-208770

(51) Int. Cl.
*H05K 1/03*  (2006.01)
(52) U.S. Cl. ........................ 174/255; 174/254
(58) Field of Classification Search ................ 174/255, 174/261, 254
See application file for complete search history.

(56) References Cited

U.S. PATENT DOCUMENTS

| | | | |
|---|---|---|---|
| 6,518,864 B1 * | 2/2003 | Ito et al. ..................... | 333/238 |
| 6,603,376 B1 * | 8/2003 | Handforth et al. ........... | 333/238 |
| 7,298,234 B2 * | 11/2007 | Dutta .......................... | 333/246 |
| 7,468,645 B2 * | 12/2008 | Yamaguchi et al. ......... | 333/238 |
| 2006/0158865 A1 * | 7/2006 | Ohmi et al. ................. | 361/795 |

FOREIGN PATENT DOCUMENTS

| | | |
|---|---|---|
| JP | 3-180096 | 8/1991 |
| JP | 2004-140268 | 5/2004 |
| JP | 2004-327745 | 11/2004 |
| JP | 2005-93499 | 4/2005 |

\* cited by examiner

*Primary Examiner*—Ishwarbhai B Patel
(74) *Attorney, Agent, or Firm*—Kratz, Quintos & Hanson, LLP

(57) ABSTRACT

A circuit board for reducing a transmission loss and a method for manufacturing the circuit board. In the circuit board including a ground layer and power layer facing each other, a wiring layer disposed between the ground layer and the power layer, and an insulating section formed between the ground layer and the power layer so as to sandwich the wiring layer therebetween, a low dielectric loss layer having a dielectric tangent lower than that of the insulating section is formed at least on an upper or lower surface of the wiring layer. According to such a circuit board, the low dielectric loss layer is formed on an interface between the insulating section and the wiring layer, and therefore, a transmission loss in a high frequency region is reduced.

10 Claims, 15 Drawing Sheets

CIRCUIT BOARD AND METHOD FOR MANUFACTURING THE SAME

CROSS-REFERENCE TO RELATED APPLICATIONS

This application is based upon and claims the benefits of priority from the prior Japanese Patent Application No. 2006-208770, filed on Jul. 31, 2006, the entire contents of which are incorporated herein by reference.

BACKGROUND OF THE INVENTION

1. Field of the Invention

The present invention relates to a circuit board and a method for manufacturing the circuit board. More particularly, the present invention relates to a circuit board for transmitting electric signals at high speed and a method for manufacturing the circuit board.

2. Description of the Related Art

Accompanying the speeding up of networking equipments, a transmission in the high frequency region higher than 1 GHz is required in a large circuit board used in a high-end server or a communication base station. For the transmission in the high frequency region, a strip line is generally used in the circuit board.

FIG. 15 is a schematic cross-sectional view of an essential part for describing a wiring structure of a strip line.

A board having this wiring structure is a most basic unit for forming a multilayer circuit board. When forming the multilayer circuit board, these units are stacked into a multilayer.

The specific structure is as follows. That is, a wiring layer 100 as a central conductor and an insulating section 101 surrounding the wiring layer 100 are provided. Further, a power layer 102 and ground layer 103 having a width remarkably wider than that of the wiring layer 100 are provided on upper and lower surfaces of the insulating section 101, respectively.

Examples of the material for the wiring layer 100, the power layer 102 and the ground layer 103 include a copper foil. Examples of the material for the insulating section 101 include a dielectric material as an organic material. According to such a wiring structure, signals in a high frequency region can be transmitted by an electromagnetic field occurring between the wiring layer 100 and the power layer 102 or between the wiring layer 100 and the ground layer 103, namely, by a quasi-transverse electromagnetic wave.

However, in a signal transmission in a high frequency region, a transmission loss due to a resistance loss or a dielectric loss generally occurs. Particularly, it is known that the transmission loss depends on a frequency and increases in a high frequency region where a transmission speed is higher than 1 GHz. Therefore, a study of reducing a transmission loss in a high frequency region where a transmission speed is higher than 1 GHz is made in a circuit board.

For example, in a study of reduction in a resistance loss, there is studied reduction in a transmission loss by reduction in a surface roughness (see, e.g., Japanese Unexamined Patent Publication No. 2004-327745). However, this study has the following problems. For the reduction in a surface roughness, a complicated surface treatment technique is used, and therefore the cost increases for practical purposes. In addition, when the surface roughness is reduced, an adhesion in an interface between a wiring layer and an insulating section decreases. Accordingly, a predetermined surface roughness is required to maintain the adhesion in an interface between the wiring layer and the insulating section. Therefore, there is a limit in realizing, reduction in a resistance loss by reducing the surface roughness.

On the other hand, in a study of reduction in a dielectric loss, there is studied reduction in a transmission loss by reduction in a dielectric constant and dielectric tangent of an insulating section (see, e.g., Japanese Unexamined Patent Publication No. 2004-140268).

The dielectric constant and dielectric tangent of the insulating material are as follows. For example, a dielectric constant and dielectric tangent of Flame Retardant Type 4 (FR-4) generally used as a material for an insulating section of a circuit board are about 4.4 and 0.02, respectively.

To the contrary, a dielectric constant and dielectric tangent of the material mainly comprising polyphenylene ether (PPE) which is expected to be a material with a low dielectric constant and a low dielectric loss are about 3.5 and 0.002, respectively. Thus, the study of realizing a low dielectric constant and low dielectric loss of the insulating section is made to reduce a transmission loss in a high frequency region where a transmission speed is higher than 1 GHz.

However, when an insulating section material having a low dielectric constant and a low dielectric loss is used to realize the reduction of a transmission loss, other characteristics such as heat characteristics, interlayer adhesion, mechanical characteristics and chemical resistance of the insulating section material decreases due to decrease in a polarity of an organic material for forming the insulating section. Accordingly, when the insulating section material having a remarkably low dielectric constant and dielectric tangent is used for the circuit board, there arises a problem that deformation of the insulating section and peeling thereof from the wiring occur, for example, in a heating process of soldering. Particularly, the organic material has a tendency that when the dielectric tangent is reduced, the dielectric constant decreases at the same time. Therefore, there is a limit in the manufacture of a material, in which only dielectric tangent is reduced while allowing heat characteristics, interlayer adhesion, mechanical characteristics and chemical resistance to be maintained. For matching a characteristic impedance of wirings, it is not preferable to largely change the dielectric constant in the insulating section of the circuit board heretofore used. Further, the transmission loss must be sufficiently reduced.

SUMMARY OF THE INVENTION

In view of the foregoing, it is an object of the present invention to provide a circuit board for reducing a transmission loss in a high frequency region. It is another object of the present invention to provide a method for manufacturing such a circuit board.

To accomplish the above objects, according to one aspect of the present invention, there is provided a circuit board comprising: a wiring layer disposed in an insulting section formed between a ground layer and a power layer facing each other, wherein a low dielectric loss layer having a dielectric tangent lower than that of the insulating section is formed at least on an upper or lower surface of the wiring layer.

According to another aspect of the present invention, there is provided a method for manufacturing a circuit board, comprising the steps of: manufacturing a first board including a ground layer and a first insulating section formed on a surface of the ground layer; manufacturing a second board including a power layer and a second insulating section formed on a surface of the power layer; forming at least on an upper or lower surface of a wiring layer a low dielectric loss layer having a dielectric tangent lower than that of the first and second insulating sections; and bonding the first and second boards to sandwich the wiring layer with the formed low dielectric loss layer by the first insulating section of the first board and the second insulating section of the second board.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
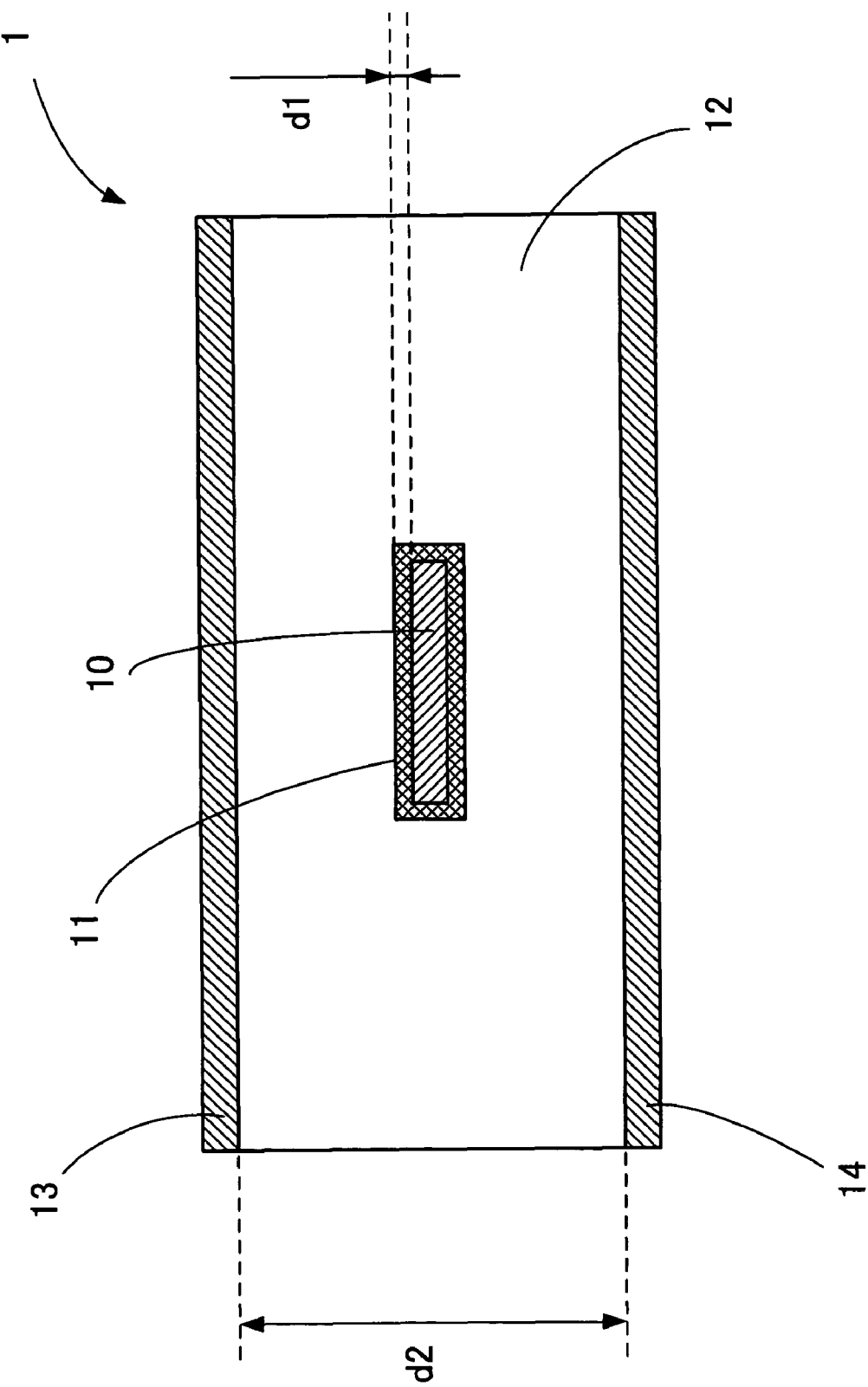
FIG. 1 is a schematic cross-sectional view of an essential part of a circuit board.

Preferred embodiments of the present invention will be described in detail below with reference to the accompanying drawings, wherein like reference numerals refer to like elements throughout.

First, an outline of a basic structure of a circuit board for forming a multilayer circuit board will be described.

FIG. 1 is a schematic cross-sectional view of an essential part of the circuit board.

The circuit board 1 has a strip wiring structure. As shown in FIG. 1, a wiring layer 10 as a central conductor is formed in the central part of the circuit board 1 and a low dielectric loss layer 11 is formed to surround the whole surface of the wiring layer 10.

Further, the wiring layer 10 and the low dielectric loss layer 11 are surrounded with an insulating section 12. On upper and lower surfaces of the insulating section 12, a power layer 13 and ground layer 14 each having a width remarkably wider than that of the wiring layer 10 are provided, respectively. Both of the insulating section 12 and the low dielectric loss layer 11 are made of dielectric materials.

Herein, examples of the material for the wiring layer 10, the power layer 13 and the ground layer 14 include copper.

Examples of the material for the low dielectric loss layer 11 include a dielectric material mainly comprising alumina (aluminum oxide). Examples of the material for the insulating section 12 include FR-4 as a glass-based epoxy resin.

An electric field strength generated in the wiring layer 10 is strongest near a surface of the wiring layer 10. A transmission loss is caused by an interaction between the wiring layer 10 and a dielectric layer near the wiring layer 10. Accordingly, when the low dielectric loss layer 11 with a low dielectric tangent is formed near the wiring layer 10 with the strongest electric field strength, suppression of the transmission loss can be achieved.

With respect to a film thickness of the layer 11, when a coating nearly equal to a surface roughness of the wiring layer 10 is formed, an effect of suppressing the transmission loss is exerted. Specifically, when a film thickness of the layer 11 is set to several µm, an effect of reducing the transmission loss is exerted (described later). Herein, the film thickness thereof is set to, for example, 2 µm or less.

A dielectric tangent of the lower dielectric loss layer 11 shown in this figure is made lower by one digit order or more than that of the insulating section 12. That is, the dielectric tangent of the layer 11 is set to one tenth or less of that of the section 12. For example, when a material for the section 12 is FR-4, a dielectric tangent thereof is 0.02, whereas when a material for the layer 11 is a dielectric material mainly comprising alumina, a dielectric tangent thereof is 0.002 or less. Therefore, the dielectric tangent of the layer 11 is one tenth or less of that of the section 12.

A propagation delay and characteristic impedance of the circuit board 1 depend on an interaction between the wiring layer 10 and ground layer 14 facing each other or an interaction between the wiring layer 10 and power layer 13 facing each other. Most of the capacity in the dielectric material existing between facing electrodes is occupied by the insulating section 12. Accordingly, the propagation delay and characteristic impedance of the board 1 depend on characteristics of the section 12. In other words, the propagation delay and characteristic impedance of the board 1 are prevented from largely varying before and after forming the low dielectric loss layer 11.

A relationship between a film thickness of the lower dielectric loss layer 11 and that of the insulating section 12 is set as follows. When the film thickness of the layer 11 is represented as d1 and that of the section 12 is represented as d2, a ratio of d2 to d1 is set to 2% or less. When the ratio is more than 2%, the capacity of the layer 11 to the section 12 increases and as a result, the propagation delay and characteristic impedance of the circuit board 1 vary due to an impact of the layer 11. Therefore, the ratio of d2 to d1 is set to 2% or less. For example, when the film thickness of the layer 11 is 2 µm, the film thickness of the section 12 is 100 µm or more.

As described above, in the circuit board 1, insulating materials such as FR-4 heretofore generally used are used as a material of the insulating section 12. Further, the thin low dielectric loss layer 11 is formed near the wiring layer 10. Accordingly, the circuit board 1 has sufficient heat characteristics, interlayer adhesion, mechanical characteristics and chemical resistance. Further, the propagation delay and characteristic impedance of the board 1 are prevented from largely varying and as a result, the transmission loss can be sufficiently reduced.

Next, results of study on an effect in a case of forming a low dielectric loss layer will be described.

In order to confirm the effect, a simulation using a 3D electromagnetic field analytic method is herein performed and the transmission loss of the circuit board is calculated.

Specifically, an electromagnetic field strength distribution within a three-dimensional structure of the circuit board is numerically simulated to thereby analyze transmission characteristics.

Figure 2:
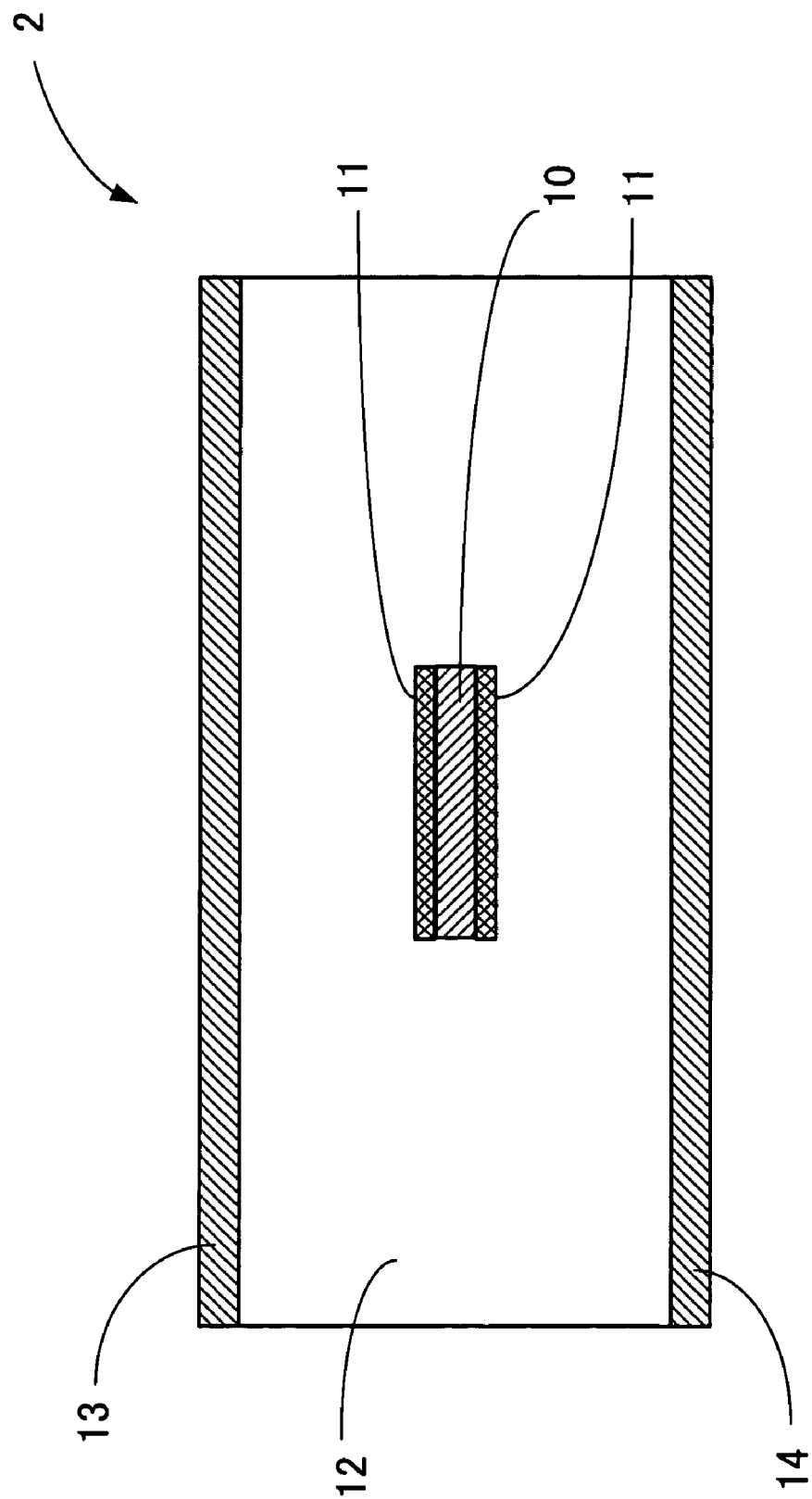
FIG. 2 is a schematic cross-sectional view of an essential part of a circuit board used in a simulation.

FIG. 2 is a schematic cross-sectional view of an essential part of a circuit board used in a simulation.

For a structure of a circuit board 2 used in a simulation, the following strip wiring structure having a 50Ω matched impedance is adopted. That is, a width of the wiring layer 10 made of copper is 54 μm and a thickness of the layer 10 is 35 μm. A material for the insulating section 12 is FR-4, a dielectric constant thereof is 4.4 and a dielectric tangent thereof is 0.02. Further, a thickness of the section 12 is 235 μm and widths of the power layer 13 and the ground layer 14 are extremely wider than that of the layer 10.

In this simulation, the strip wiring structure is adopted. Therefore, there is assumed a transmission mode where a signal is transmitted by the electromagnetic field occurring in the direction between the wiring layer 10 and the power layer 13 or between the layer 10 and the ground layer 14. That is, there is assumed a transmission mode where a signal is transmitted by the electromagnetic field occurring between facing electrodes.

Accordingly, it is predicted that by forming the low dielectric loss layer 11 along the direction between the facing electrodes, more specifically, only on the upper and lower surfaces of the wiring layer 10 shown in this figure, a sufficient loss reduction effect is obtained. The analysis is performed by the simulation of the effect.

Specifically, on the upper and lower surfaces of the layer 10, the low dielectric loss layer 11 as an alumina layer having a dielectric constant of 9.8 and a dielectric tangent of 0.0001 is provided as an example. A thickness of the layer 11 is set to 1 μm. That is, a ratio of a thickness 1 μm of the alumina layer to a thickness 235 μm of the insulating section 12 is 0.4% in this model. Further, the transmission loss of the circuit board 2 is calculated by the meter in the lengthwise direction of the board 2.

Figure 3:
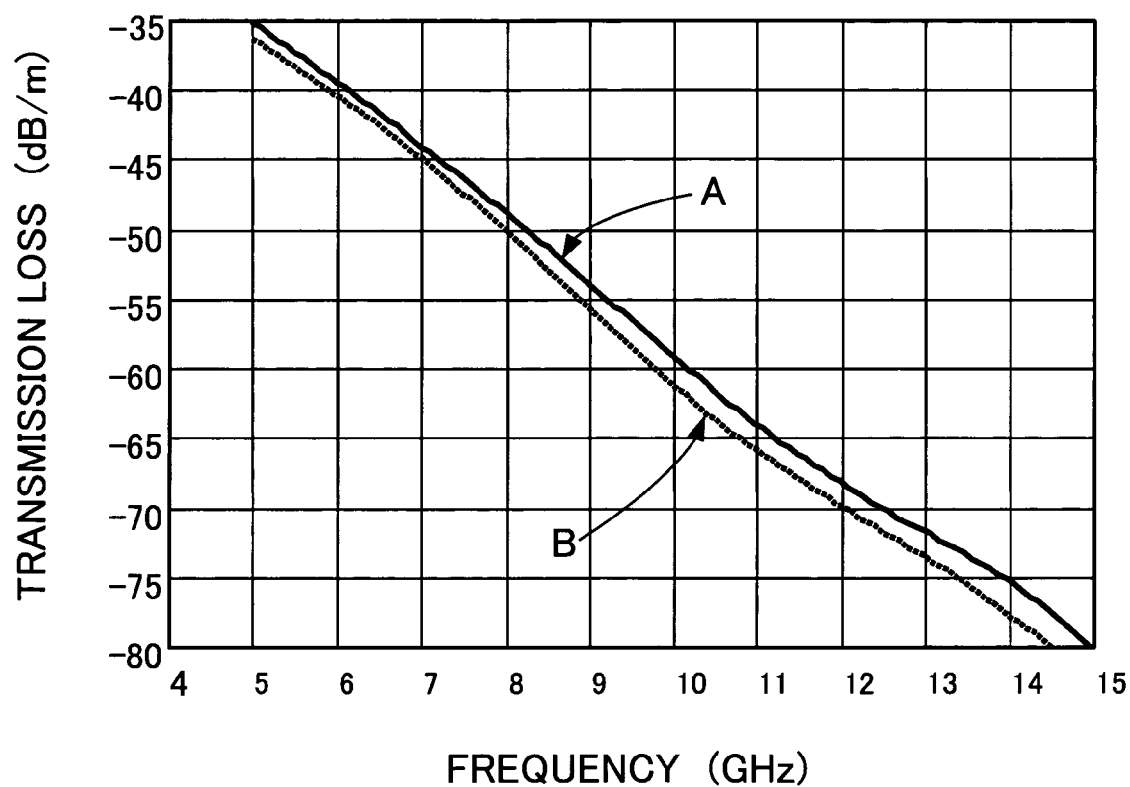
FIG. 3 shows a relationship between frequency and transmission loss.

FIG. 3 shows a relationship between the frequency and the transmission loss.

In this simulation, a line A represents a case of providing the low dielectric loss layer and a line B represents a case of providing no low dielectric loss layer.

By comparing the cases A and B from this figure, it is seen that a transmission loss of the case A is smaller than that of the case B. Specifically, the following facts are recognized. When the frequency is in the range of 5 to 8 GHz, the case A has a loss reduction effect of about 1.5 dB/m as compared with the case B. When the frequency is in the range of 8 to 10 GHz, the case A has a loss reduction effect of about 2 dB/m as compared with the case B. When the frequency is in the range of 10 GHz or more, the case A has a loss reduction effect of about 3 dB/m as compared with the case B. Thus, it is seen that as the frequency becomes higher, the loss reduction effect more increases in this model.

Further, in this simulation, the calculation is performed assuming that a surface of the wiring layer is an ideal plane. A wiring surface of a real product is rougher than that of the model used in the simulation. Accordingly, in a real product having no low dielectric loss layer, the transmission loss increases more than that of the case B. As a result, when comparing a real product having the low dielectric loss layer with a real product having no low dielectric loss layer, the loss reduction effect in the real product increases more than that in a comparative example described using FIG. 3.

In the description of FIG. 2, the low dielectric loss layer 11 is formed on the upper and lower surfaces of the wiring layer 10. In the strip wiring structure, a signal is transmitted by an electromagnetic field occurring in the direction between the wiring layer 10 and the power layer 13 or between the wiring layer 10 and the ground layer 14. Accordingly, when the layer 11 is formed at least on the upper or lower surface of the layer 10, an effect of reduction in a transmission loss can be exerted. That is, in the circuit board 2 shown in FIG. 2, when the layer 11 is formed on any one of the upper and lower surfaces of the layer 10, reduction in the transmission loss can be realized.

Next, a specific method for manufacturing the circuit board 1 shown in FIG. 1 will be described. In this manufacturing method, a first to third manufacturing methods will be described.

FIGS. 4 and 5, and FIGS. 7 to 14 are schematic cross-sectional views of an essential part in the specific method for manufacturing the circuit board.

<First Manufacturing Method>

First, the first manufacturing method will be described.

Figure 4:
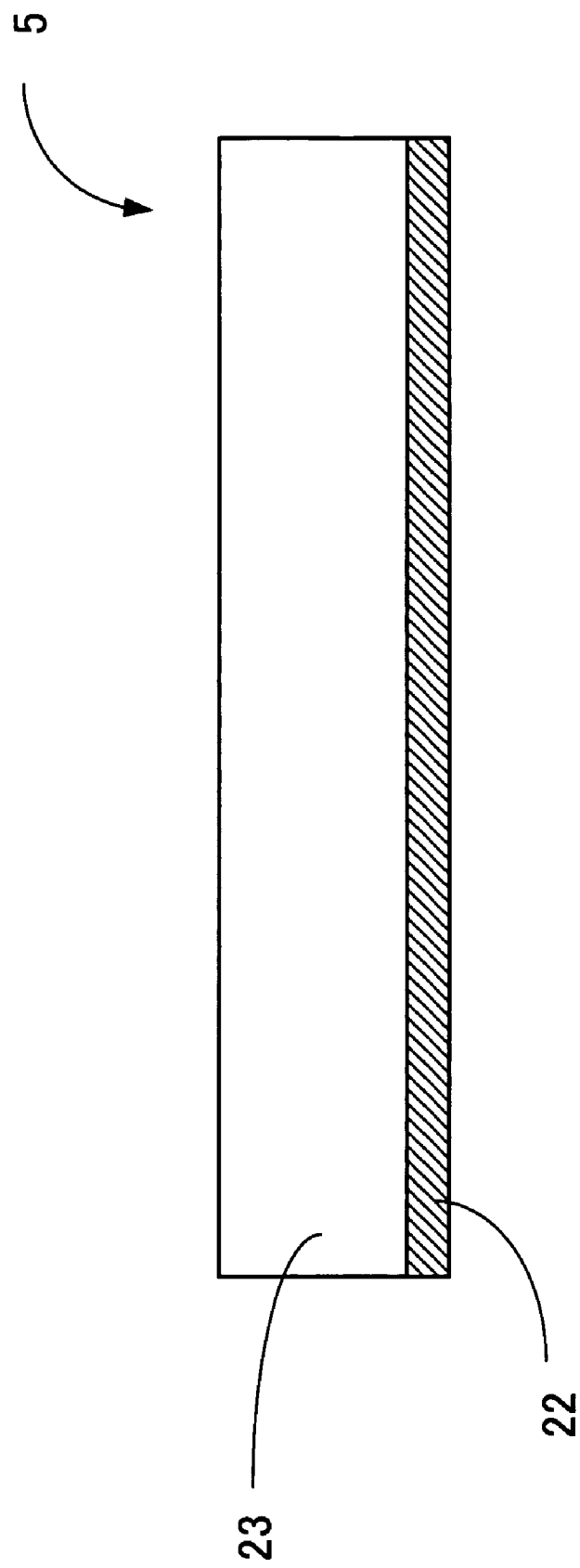
FIG. 4 is a schematic cross-sectional view of an essential part of a board manufacturing process.

FIG. 4 is a schematic cross-sectional view of an essential part in a board manufacturing process.

On a metal plate serving as a ground layer 22, an insulating section 23 is bonded by hot press to manufacture a board 5 for forming a circuit board. The board is defined as a first board. Examples of a material for the ground layer 22 include copper. Examples of a material for the insulating section 23 include FR-4.

Figure 5:
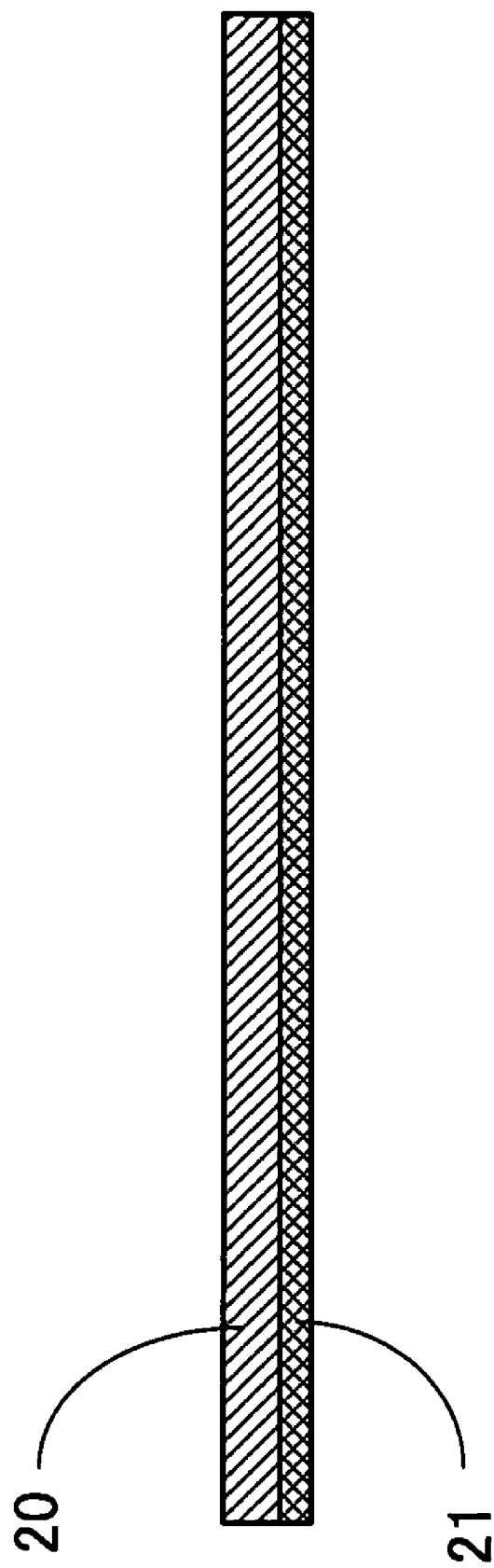
FIG. 5 is a first schematic cross-sectional view of an essential part of a low dielectric loss layer forming process.

FIG. 5 is a schematic cross-sectional view of an essential part in a low dielectric loss layer forming process.

Next, on a lower surface of a copper foil 20 serving as a wiring, a low dielectric loss layer 21 mainly comprising alumina is formed as an example.

Herein, a material prepared as follows is used as a material for the low dielectric loss layer 21. That is, 92% by weight of alumina powder having a particle size of 0.3 μm is dispersed into a mixture composed of a bisphenol A epoxy resin, a phenolic curing agent and a catalyst to prepare a varnish. Then, the varnish is diluted with methyl ethyl ketone to adjust its viscosity.

In order to bond the low dielectric loss layer 21 on the lower surface of the copper foil 20, the above-described material is coated on the lower surface of the copper foil 20. Then, the material is dried and cured with heat.

A reason why 92% by weight of the alumina powder is dispersed as a material for the low dielectric loss layer 21 will be herein described.

Figure 6:
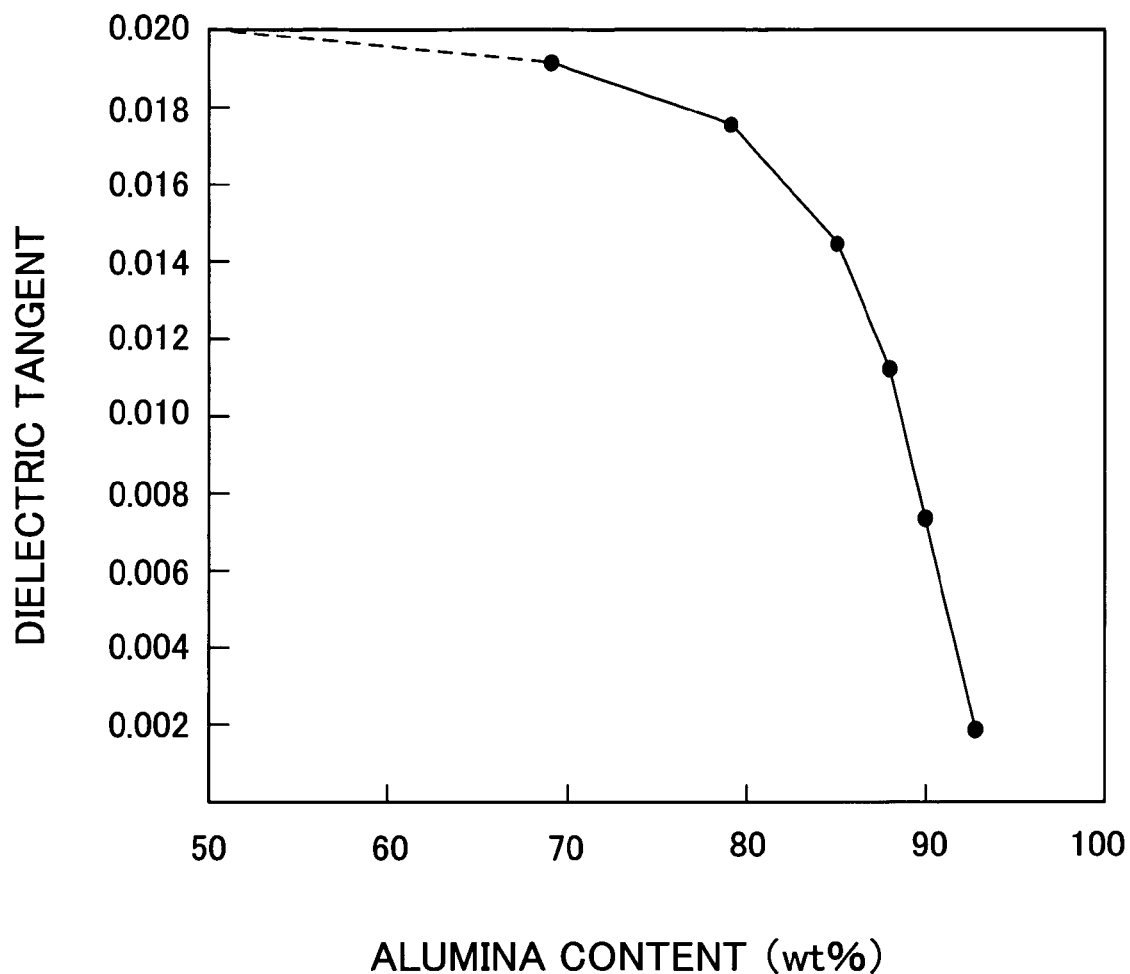
FIG. 6 shows a relationship between alumina content and dielectric tangent.

FIG. 6 shows a relationship between an alumina content and a dielectric tangent.

Specifically, FIG. 6 shows a relationship between a dielectric tangent and an alumina content (% by weight) in a varnish prepared by dispersing alumina powder having a particle size of 0.3 μm into a mixture composed of a bisphenol A epoxy resin, a phenolic curing agent and a catalyst. This relationship is found as follows. That is, the varnish prepared by changing the alumina content (% by weight) is dried and cured with heat to manufacture a plate with a thickness of 0.5 mm. Then, the plate is sandwiched by flat-plate electrodes to measure a dielectric tangent. In this figure, the horizontal axis shows the alumina content (% by weight) and the vertical axis shows the dielectric tangent.

From this figure, the following facts are found. When the alumina content is from 50% to 70% by weight, the dielectric tangent gradually decreases. When the alumina content exceeds 70% by weight, the dielectric tangent rapidly decreases. When the alumina content is 92% by weight or more, the dielectric tangent is 0.002 or less.

As described above, the dielectric tangent of FR-4 is 0.02. A dielectric tangent which is one tenth or less of this value is 0.002 or less. Therefore, 92% by weight or more of alumina must be incorporated as a material for the low dielectric loss layer 21. Accordingly, a dielectric material prepared by incorporating 92% by weight of alumina is herein used.

Figure 7:
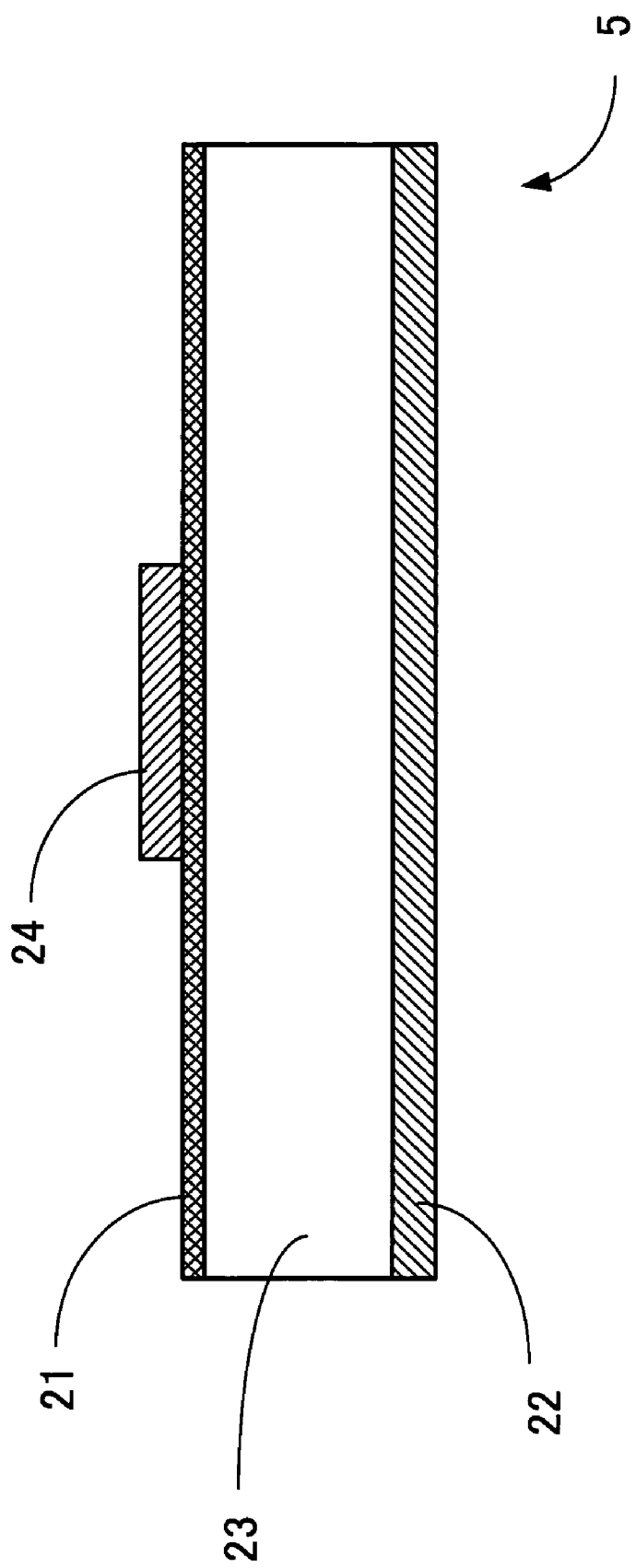
FIG. 7 is a schematic cross-sectional view of an essential part of a wiring layer patterning process.

FIG. 7 is a schematic cross-sectional view of an essential part in a wiring layer patterning process.

On the board 5 manufactured by forming the insulating section 23 on an upper surface of the ground layer 22, the copper foil 20 having been formed thereon the low dielectric loss layer 21 shown in FIG. 5 is bonded by hot press (not shown). Further, a patterning is performed by etching to thereby form a wiring layer 24. Examples of a material for the insulating section 23 include FR-4. Through this process, the wiring layer 24 is formed on the board 5.

Figure 8:
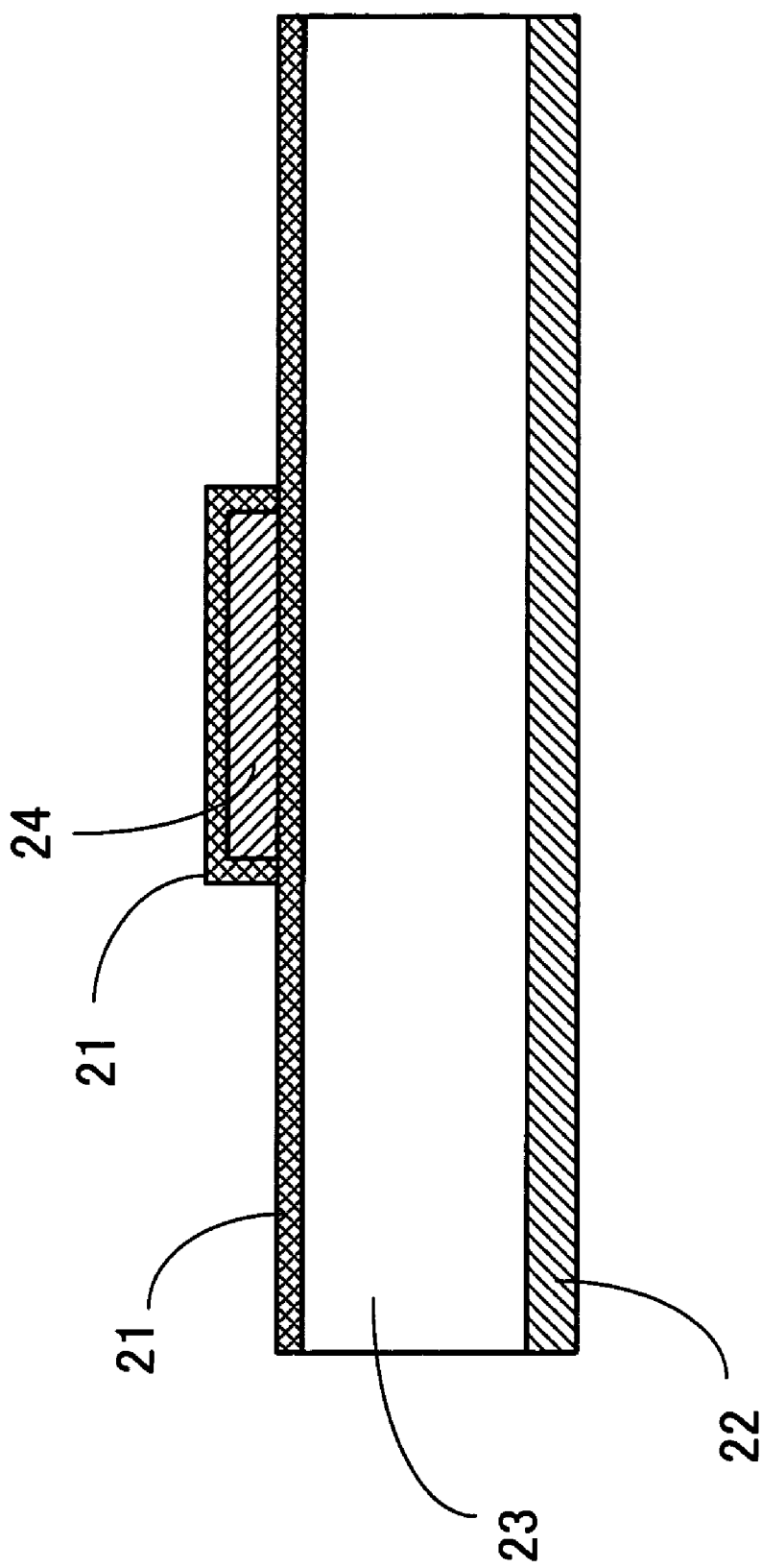
FIG. 8 is a second schematic cross-sectional view of an essential part of a low dielectric loss layer forming process.

FIG. 8 is a schematic cross-sectional view of an essential part in a low dielectric loss layer forming process.

After forming the wiring layer 24, the low dielectric loss layer 21 is formed on upper and side surfaces of the wiring layer 24. The formation of the layer 21 in this process is performed by any one of the following methods. One is the aerodeposition method for spraying at high pressure the varnish prepared in the low dielectric loss layer forming process of FIG. 5. The other is a method for coating a resin varnish containing an inorganic oxide particle in high concentration.

Figure 9:
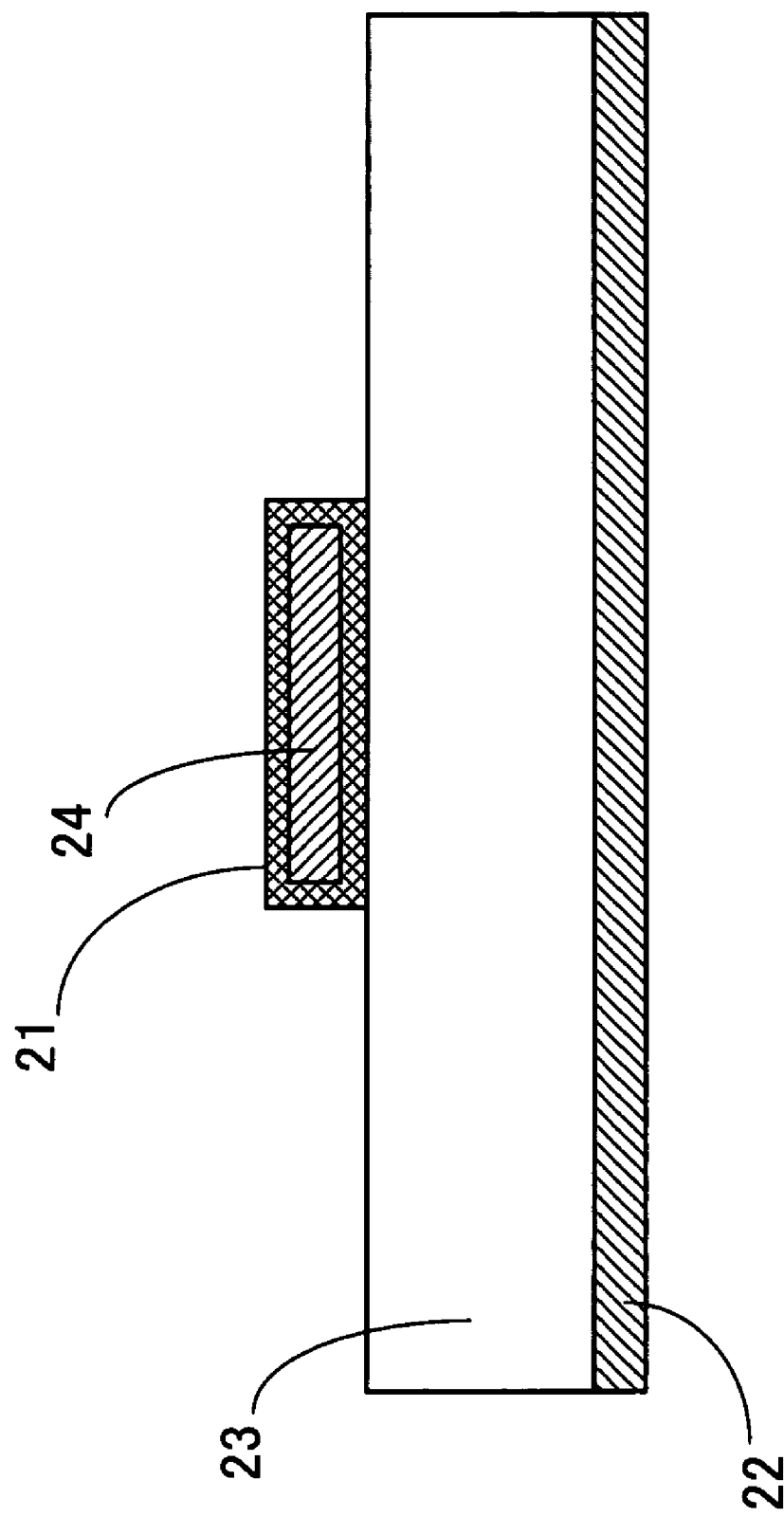
FIG. 9 is a schematic cross-sectional view of an essential part of an insulating section forming process.

FIG. 9 is a schematic cross-sectional view of an essential part in an insulating section forming process.

In order to allow the layer 21 formed on the upper surface and side surfaces of the layer 24 to remain, the low dielectric loss layer 21 on the insulating layer 23 is etched to expose the surface of the section 23 on both sides of the layer 24.

Figure 10:
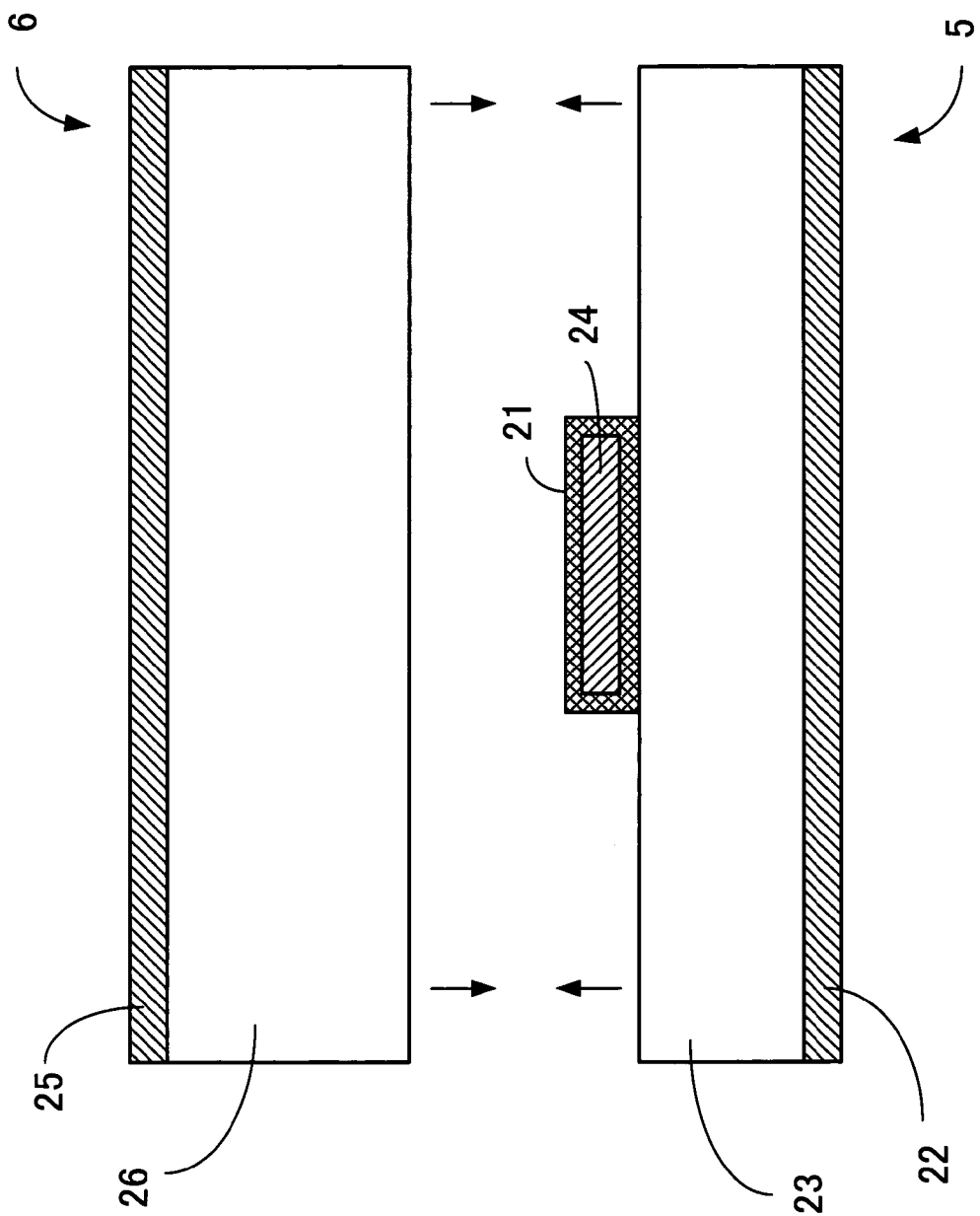
FIG. 10 is a first schematic cross-sectional view of an essential part of a bonding process.

FIG. 10 is a schematic cross-sectional view of an essential part in a bonding process.

Further, in order to sandwich the wiring layer 24 covered with the low dielectric loss layer 21 from a longitudinal direction, the board 5 manufactured by forming the insulating section 23 on the upper surface of the ground layer 22 and the board 6 manufactured by forming the insulating section 26 on the lower surface of the power layer 25 are combined to face each other. Then, both of the boards 5 and 6 are bonded by hot press. The board 6 is defined as a second board and previously manufactured before the bonding. Finally, a circuit board having the same structure as that of the circuit board 1 shown in FIG. 1 is completed.

<Second Manufacturing Method>

Next, a second manufacturing method will be described. The second manufacturing method is a modification example of the first manufacturing method. In this manufacturing method, the same elements as those shown in FIGS. 4 to 8 in the first method are indicated by the same reference numerals as those in the first method. Further, the manufacturing processes shown in FIGS. 4 to 8 can be performed by the same manufacturing processes as those in the first method. Therefore, the detailed description of the processes will be omitted and a description will be made from the next process of that shown in FIG. 8.

Figure 11:
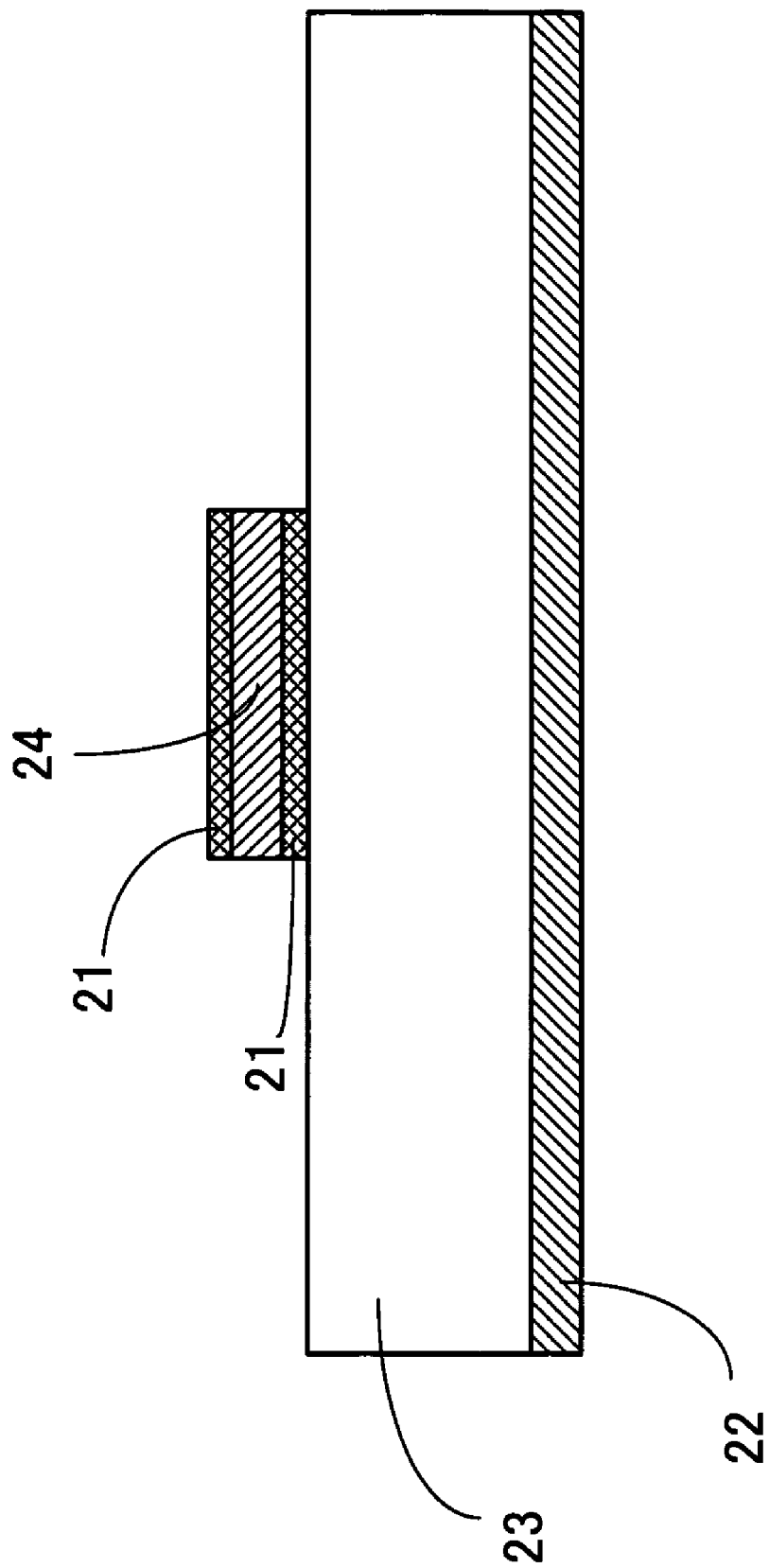
FIG. 11 is a schematic cross-sectional view of an essential part of an etching process.

FIG. 11 is a schematic cross-sectional view of an essential part in an etching process.

The low dielectric loss layer 21 formed on the insulating section 23 and on the side surfaces of the wiring layer 24 is etched to expose the surface of the section 23 and the side surfaces of the layer 24.

Figure 12:
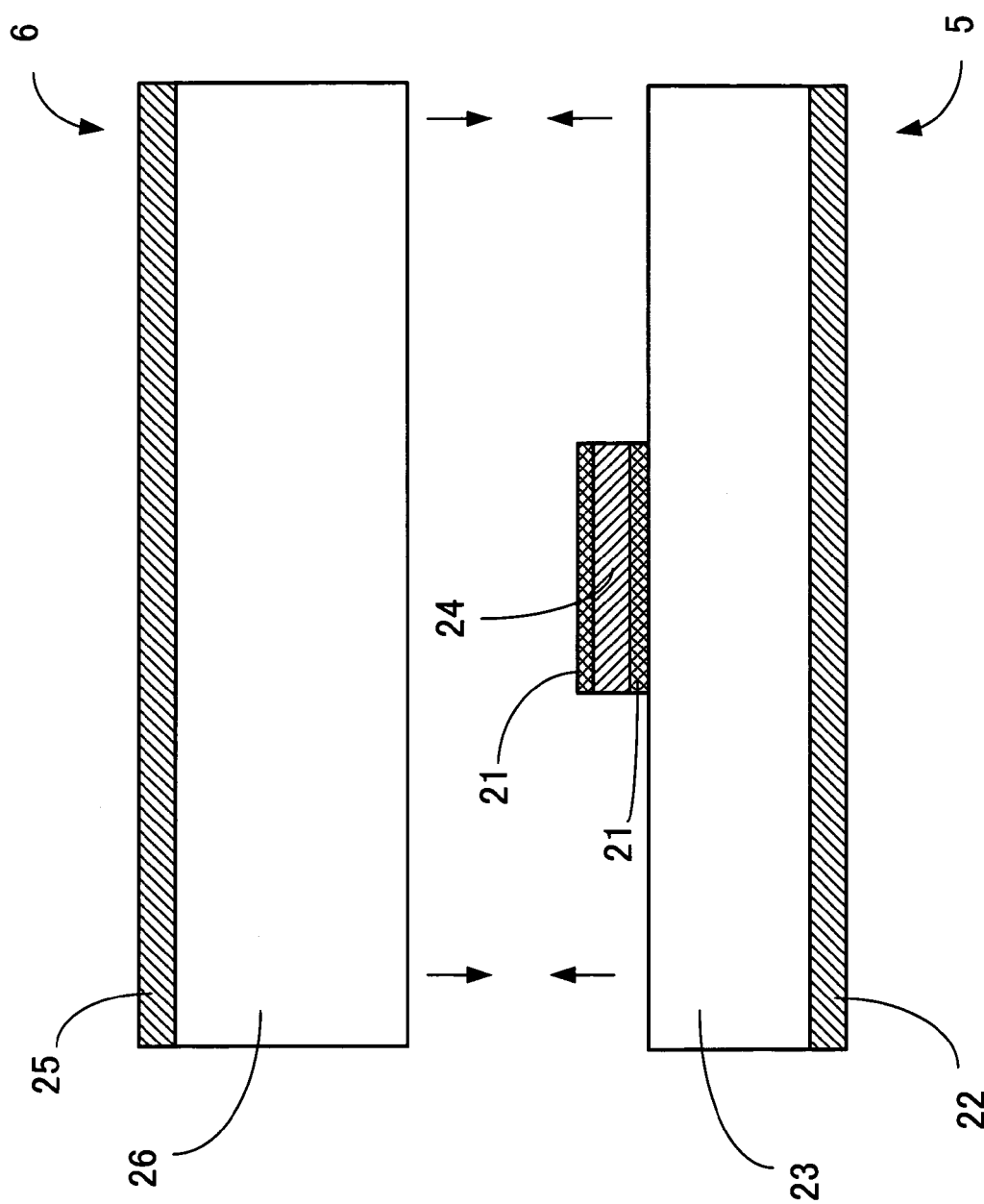
FIG. 12 is a second schematic cross-sectional view of an essential part of a bonding process.

FIG. 12 is a schematic cross-sectional view of an essential part in a bonding process.

In order to sandwich the wiring layer 24 covered with the low dielectric loss layer 21 from a longitudinal direction, the board 5 manufactured by forming the insulating section 23 on the upper surface of the ground layer 22 and the board 6 manufactured by forming the insulating section 26 on the lower surface of the power layer 25 are combined to face each other. Then, both of the boards 5 and 6 are bonded by hot press. Finally, a circuit board having the same structure as that of the circuit board 2 shown in FIG. 2 is completed.

<Third Manufacturing Method>

Next, a third manufacturing method will be described. The third manufacturing method is a further modification example of the first and second manufacturing methods. In this manufacturing method, the same elements as those shown in FIGS. 4 to 8 in the first and second methods are indicated by the same reference numerals as those in the first and second methods. Further, the manufacturing processes shown in FIGS. 4 to 8 can be performed by the same manufacturing processes as those in the first and second methods. Therefore, the detailed description of the processes will be omitted and a description will be made from the next process of that shown in FIG. 8.

Figure 13:
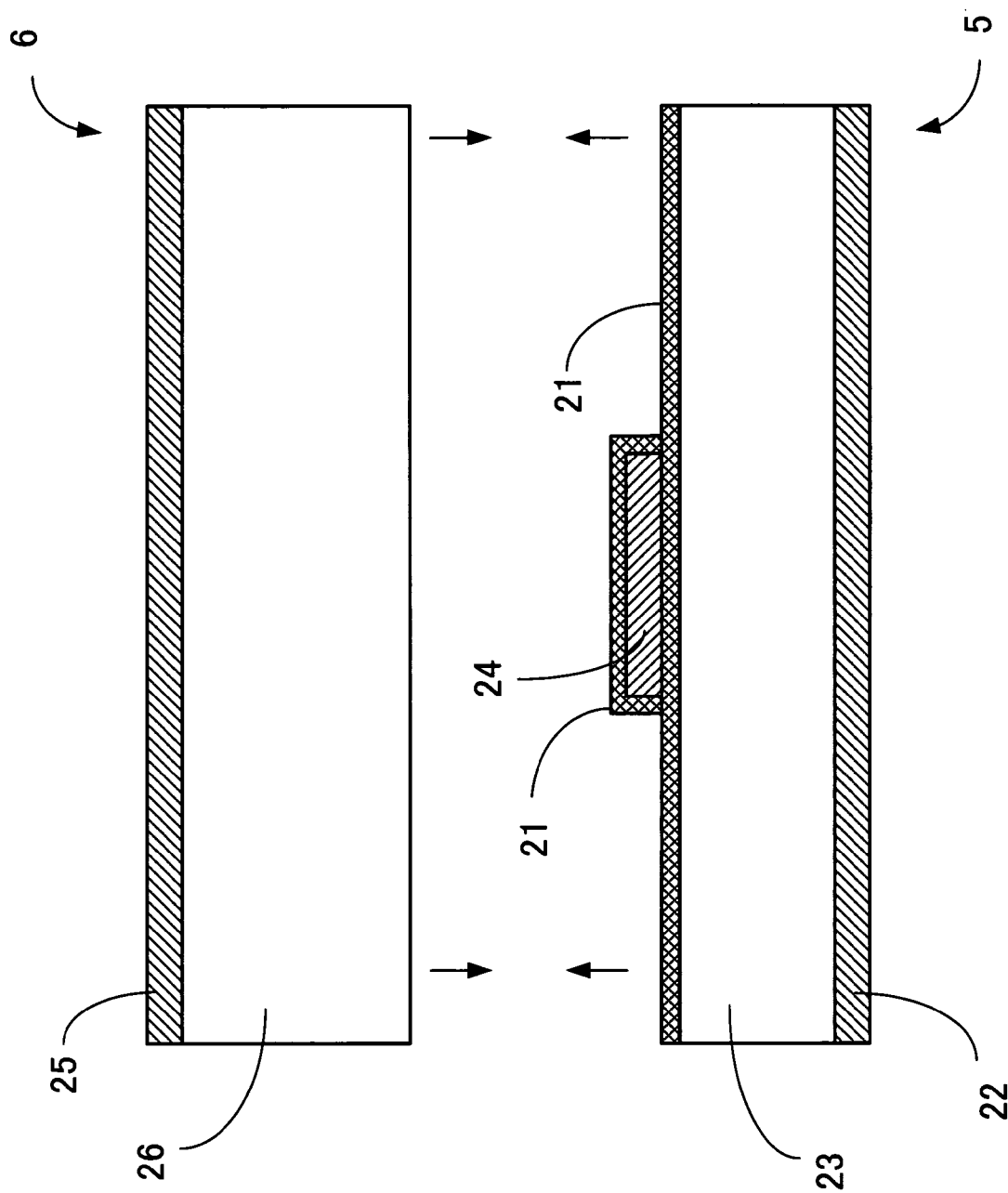
FIG. 13 is a third schematic cross-sectional view of an essential part of a bonding process.

FIG. 13 is a schematic cross-sectional view of an essential part in a bonding process.

In order to sandwich the wiring layer 24 covered with the low dielectric loss layer 21 from a longitudinal direction, the board 5 manufactured by forming the insulating section 23 on the upper surface of the ground layer 22 and the board 6 manufactured by forming the insulating section 26 on the lower surface of the power layer 25 are combined to face each other. Then, both of the boards 5 and 6 are bonded by hot press.

Figure 14:
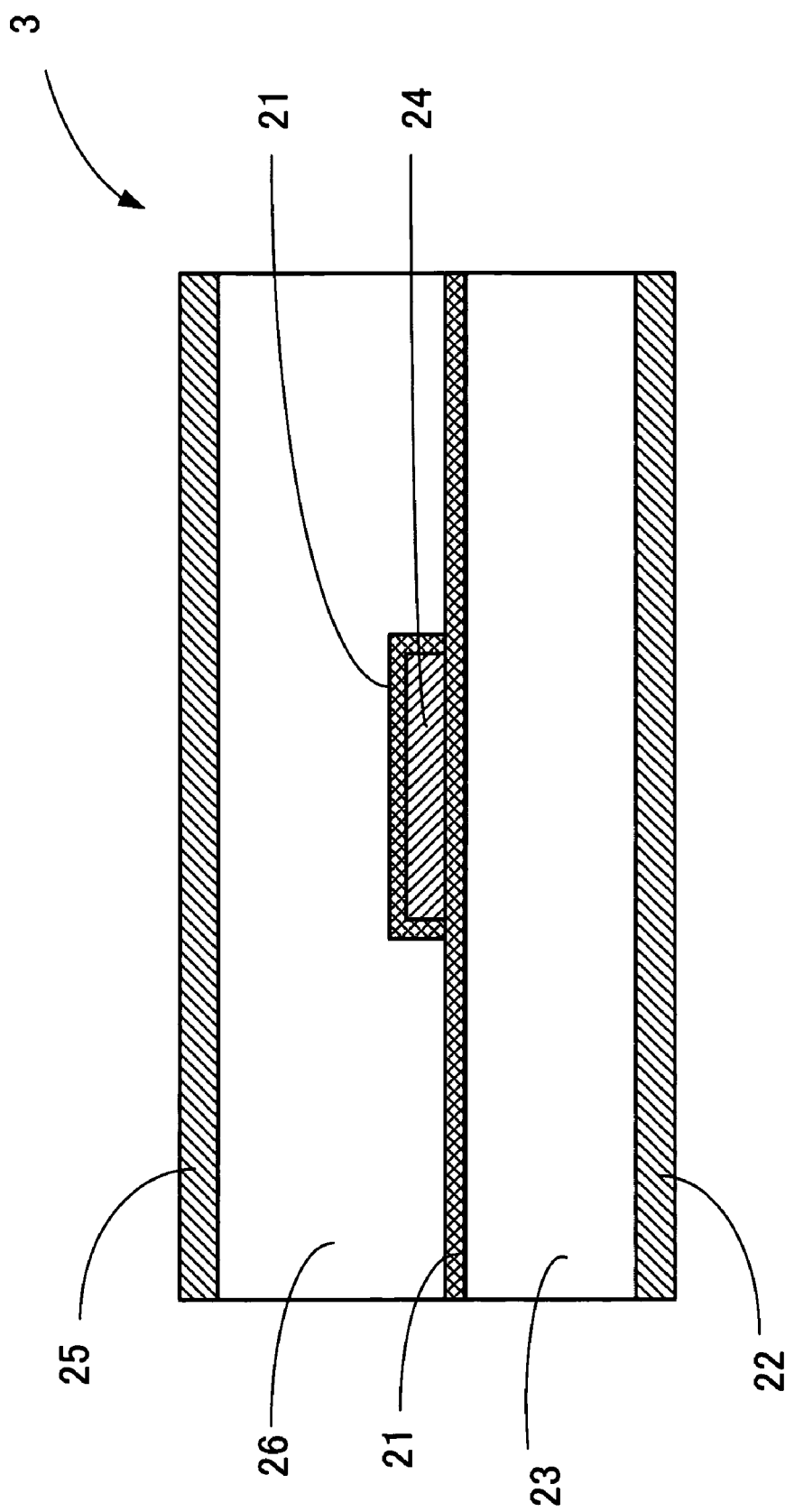
FIG. 14 is a schematic cross-sectional view of an essential part of the circuit board after the bonding.
Figure 15:
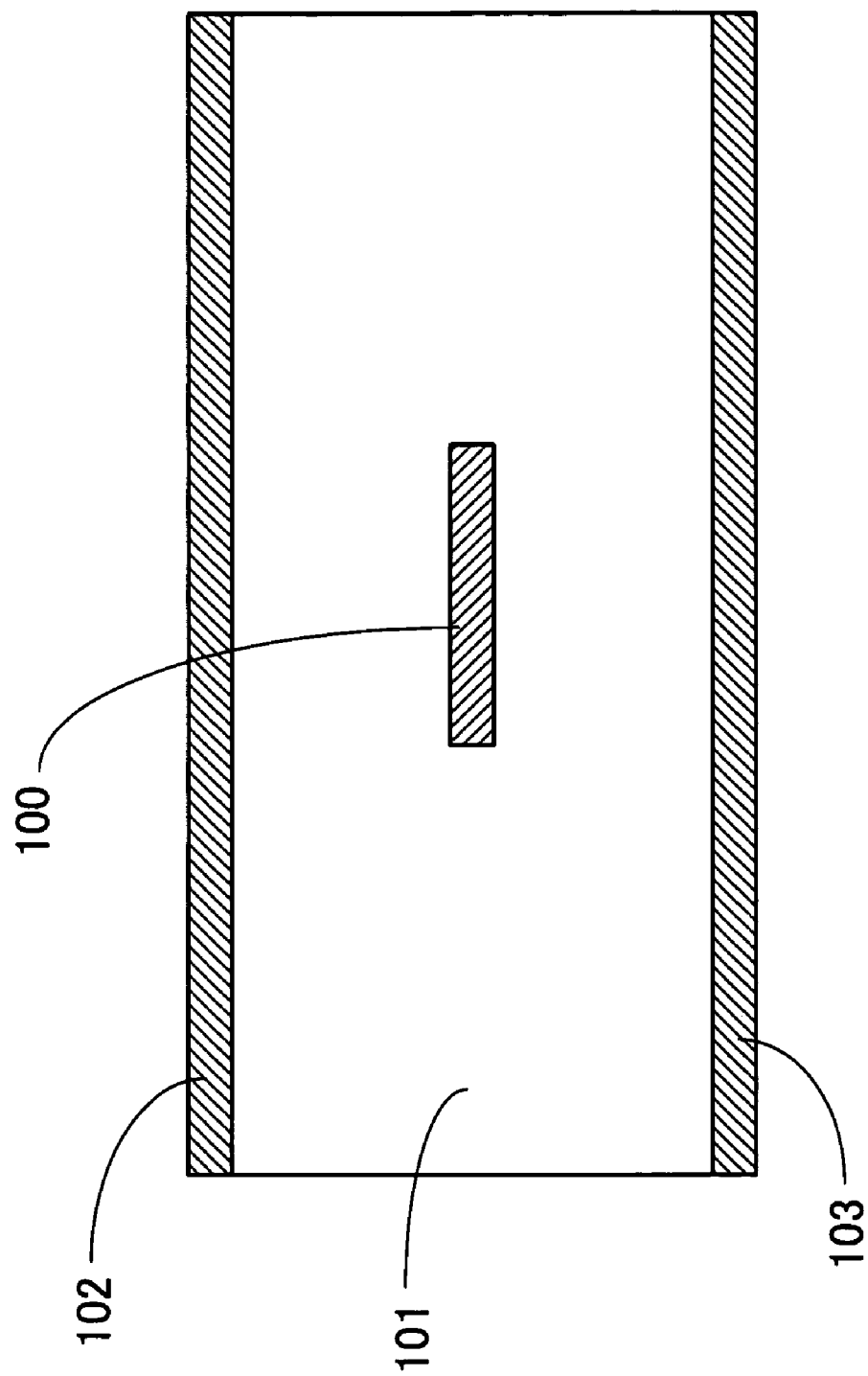
FIG. 15 is a schematic cross-sectional view of an essential part for describing a wiring structure of a strip line.

FIG. 14 is a schematic cross-sectional view of an essential part of the circuit board after the bonding.

After bonding both of the boards 5 and 6 by hot press, a circuit board 3 is completed.

In the circuit board 3, the low dielectric loss layer 21 remains between the insulating sections 23 and 26. In the strip wiring structure, a signal is transmitted by an electromagnetic field occurring in the direction between the wiring layer 24 and the power layer 25 or between the wiring layer 24 and the ground layer 22, as described above. Accordingly, when the layer 21 is formed at least on the upper or lower surface of the layer 24, reduction in the transmission loss can be realized. Even if the layer 21 is formed between the insulating sections 23 and 26, no impact is made on the electric characteristics such as a propagation delay and a characteristic impedance.

In the above description, alumina is used as a material for the low dielectric loss layer; however, the present invention is not particularly limited to alumina. Other ceramic materials having low dielectric tangent such as silica may be used.

In the description of FIGS. 1 and 2, the power layer 13 is provided on the upper surface of the insulating section 12 and the ground layer 14 is provided on the lower surface of the insulating section 12. Alternatively, the power layer 13 may be provided on the lower surface of the insulating section 12 and the ground layer 14 may be provided on the upper surface of the insulating section 12. Likewise, in the description of FIG. 14, the power layer 25 is provided on the upper surface of the insulating layer 26 and the ground layer 22 is provided on the lower surface of the insulating layer 23. Alternatively, the power layer 25 may be provided on the lower surface of the insulating layer 23 and the ground layer 22 may be provided on the upper surface of the insulating layer 26.

In the present invention, in the circuit board including a ground layer and power layer facing each other, a wiring layer disposed between the ground layer and the power layer, and an insulating section formed between the ground layer and the power layer so as to sandwich the wiring layer therebetween, a low dielectric loss layer having a dielectric tangent lower than that of the insulating section is formed at least on an upper or lower surface of the wiring layer.

As a result, there can be realized a circuit board for reducing a transmission loss in a high frequency region.

Further, according to the present invention, a first board including a ground layer and an insulating section formed on a surface of the ground layer is manufactured; a second board including a power layer and an insulating section formed on a surface of the power layer is manufactured; a low dielectric loss layer having a dielectric tangent lower than that of the insulating section is formed at least on an upper or lower surface of a wiring layer; and the first and second boards are bonded to sandwich the wiring layer having formed thereon the low dielectric loss layer by the insulating section of the first board and that of the second board.

As a result, there can be realized a manufacturing method of a circuit board for reducing a transmission loss in a high frequency region.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A circuit board comprising a wiring layer disposed in an insulating section formed between a ground layer and a power layer facing each other, wherein a low dielectric loss layer having a dielectric tangent lower than that of the insulating section is formed on an upper and a lower surfaces of the wiring layer, and a film thickness of the low dielectric loss layer is 2% or less that of the insulating section.

2. The circuit board according to claim 1, wherein the low dielectric loss layer is formed on upper and lower surfaces of the wiring layer.

3. The circuit board according to claim 1, wherein the low dielectric loss layer is formed on upper, lower and side surfaces of the wiring layer.

4. The circuit board according to claim 1, wherein a dielectric tangent of the low dielectric loss layer is one tenth or less of that of the insulating section.

5. The circuit board according to claim 4, wherein the dielectric tangent of the low dielectric loss layer is 0.002 or less.

6. The circuit board according to claim 1, wherein a material of the low dielectric loss layer is a thermosetting resin containing a metal oxide.

7. The circuit board according to claim 6, wherein the thermosetting resin contains 92% by weight of the metal oxide.

8. The circuit board according to claim 6, wherein the metal oxide is one of alumina and silica.

9. The circuit board according to claim 1, wherein a film thickness of the low dielectric loss layer is 2 µm or less.

10. The circuit board according to claim 1, wherein a ratio of a thickness of the low dielectric loss layer to that of the insulating section is 2% or less.

* * * * *